(12) United States Patent
Lin et al.

(10) Patent No.: US 6,815,290 B2
(45) Date of Patent: Nov. 9, 2004

(54) STACKED GATE FLASH MEMORY DEVICE AND METHOD OF FABRICATING THE SAME

(75) Inventors: Chi-Hui Lin, Taipei (TW); Chung-Lin Huang, Taichung (TW)

(73) Assignee: Nanya Technology Corporation, Taoyuan (TW)

( * ) Notice: Subject to any disclaimer, the term of this patent is extended or adjusted under 35 U.S.C. 154(b) by 0 days.

(21) Appl. No.: 10/457,867

(22) Filed: Jun. 10, 2003

(65) Prior Publication Data
US 2004/0075134 A1 Apr. 22, 2004

(30) Foreign Application Priority Data
Oct. 21, 2002 (TW) ..................................... 91124260 A (51) Int. Cl.[7] ................. H01L 21/336; H01L 21/3205
(52) U.S. Cl. .................. 438/257; 438/259; 438/268; 438/270; 438/589; 438/593; 438/594
(58) Field of Search .................. 438/257, 259, 438/268, 270, 589, 593, 594

(56) References Cited

U.S. PATENT DOCUMENTS

| | | | |
|---|---|---|---|
| 5,210,047 A | * | 5/1993 | Woo et al. ................. 438/257 |
| 5,315,142 A | | 5/1994 | Acovic et al. |
| 5,703,387 A | | 12/1997 | Hong |
| 5,998,261 A | * | 12/1999 | Hofmann et al. ............ 438/257 |
| 6,087,222 A | * | 7/2000 | Jung Lin et al. ............ 438/259 |
| 6,239,465 B1 | * | 5/2001 | Nakagawa ................... 257/331 |
| 6,437,397 B1 | | 8/2002 | Lin et al. |

OTHER PUBLICATIONS

Wolf, Ph.D., Stanley, Richard N. Tauber, Ph.D., "Chemical Vapor Deposition of Amorphous and Polycrystalline Films," Silicon Processing for the VLSI Era—vol. 1: Process Technology, Lattice Press, 1986, pp. 177–180 and 191–194.*

* cited by examiner

Primary Examiner—Mary Wilczewski
Assistant Examiner—Toniae M. Thomas
(74) Attorney, Agent, or Firm—Quintero Law Office (57) ABSTRACT

A stacked gate flash memory device and method of fabricating the same. A cell of the stacked gate flash memory device in accordance with the invention is disposed in a cell trench within a substrate and source and drain regions are formed in the same substrate side of the adjacent isolation trenches. Thus, the stacked gate flash memory device of the invention can achieve high integration of memory cells.

18 Claims, 12 Drawing Sheets

FIG. 4e

STACKED GATE FLASH MEMORY DEVICE AND METHOD OF FABRICATING THE SAME

BACKGROUND OF THE INVENTION

1. Field of the Invention

The present invention relates to a semiconductor device and method of fabricating the same. More particularly, it relates to a stacked gate flash memory device that can achieve high memory cell capacity.

2. Description of the Related Art

Complementary metal oxide semiconductor (CMOS) memory is generally categorized into two groups: random access memory (RAM) and read only memory (ROM). RAM is a volatile memory, wherein the stored data disappears when power is turned off. On the contrary, turning off power does not affect the stored data in a ROM.

In the past few years, market share of ROM has been continuously expanding, and the type attracting the most attention has been flash memory. The fact that a single memory cell is electrically programmable and multiple memory cell blocks are electrically erasable allows flexible and convenient application, superior to electrically programmable read only memory (EPROM), electrically erasable programmable read only memory (EEPROM) and programmable read only memory (PROM). Furthermore, fabricating flash memory is cost effective. Having the above advantages, flash memory has been widely applied in consumer electronic products, such as digital cameras, digital video cameras, mobile phones, notebooks, personal stereos and personal digital assistant (PDA).

Since portability of these electrical consumer products is strongly prioritized by consumers, the size of the products must be minimal. As a result, capacity of flash memory must increase, and functions must be maximized while size thereof is continuously minimized. Having an increased amount of access data, capacity of memory cells has been enhanced from 4 to 256 MB, and even 1G byte will become the market trend in the near future.

Hence, there is a need for a flash memory device with high memory cell capacity.

SUMMARY OF THE INVENTION

Accordingly, an object of the invention is to provide a stacked gate flash memory device that can achieve high integration of memory cells thereof.

Another object of the invention is to provide a method of fabricating a stacked gate flash memory device, wherein the driving currents in memory cells thereof can be increased without increasing the surfaces thereof.

Thus, a stacked gate flash memory cell in accordance with the present invention comprises a substrate having a cell trench and two adjacent isolation trenches therein, the cell trench having two substrate sides and two isolation sides contacting the adjacent isolation trenches, the isolation trench having two substrate sides and one cell side contacting the adjacent cell trench. A bottom insulating layer is disposed on the bottom of the cell trench. A pair of tunnel oxide layers, each is disposed on the substrate side of the cell trench and the bottom insulating layer. A pair of floating gates, each is disposed on the substrate side of the cell trench and covering the tunnel oxide layer. A conformal inter-gate dielectric layer overlies the tunnel oxide layers and the bottom insulating layer. A control gate overlies the inter-gate dielectric layer in the cell trench. Two pairs of source/drain regions, each is respectively disposed on the same substrate side of each isolation trench.

Furthermore, the method of fabricating the stacked gate flash memory cell in accordance with the present invention comprises providing a substrate, forming two parallel shallow trench isolation (STI) regions along a first direction thereon, forming a long trench in the substrate between the STI regions, wherein the long trench is parallel to the STI regions, forming a bottom insulating layer in the long trench, performing a threshold voltage (Vt) implant process on the sidewalls of the long trench, forming a tunnel oxide layer on each sidewall of the long trench, forming a floating gate on each sidewall of the long trench, covering the tunnel oxide layer thereon, forming a conformal inter-gate dielectric layer overlying the floating gates and the bottom insulating layer within the long trench, blanketly depositing a polysilicon layer covering the substrate and the inter-gate dielectric layer within the long trench, blanketly depositing a metal layer on the polysilicon layer, blanketly depositing a protecting layer on the metal layer, forming a plurality of parallel wordlines along a second direction, dividing the long trench into a plurality of first areas covered by the wordlines and a plurality of second areas not covered by the wordlines over the long trench, forming a spacer on each sidewall of the word lines, partially covering the second area, forming a plurality of third areas not covered by the wordlines and the spacers, forming a plurality of source/drain regions in the substrate adjacent to the second areas, and forming a second insulating layer within the second areas, wherein a plurality of cell trenches are formed under the first areas and a plurality of isolation trenches are formed under the second areas.

Advantages of the present invention are described herein.

First, cells of the flash memory device in accordance with the invention are disposed in trenches within a substrate that can achieve higher integration of memory cells than in the Prior Art.

Second, the channel between the source region and the drain region is horizontal. Source and drain regions can be formed on the same substrate side of the adjacent isolation trenches. Functions of source and drain regions can be decided according to the practical bitline design, providing suitable bitline design flexibility of the process.

Third, most of the fabricating processes in the invention are self-aligned such that additional lithography processes and number of masks for the whole fabricating process can be reduced.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

Figure 1:
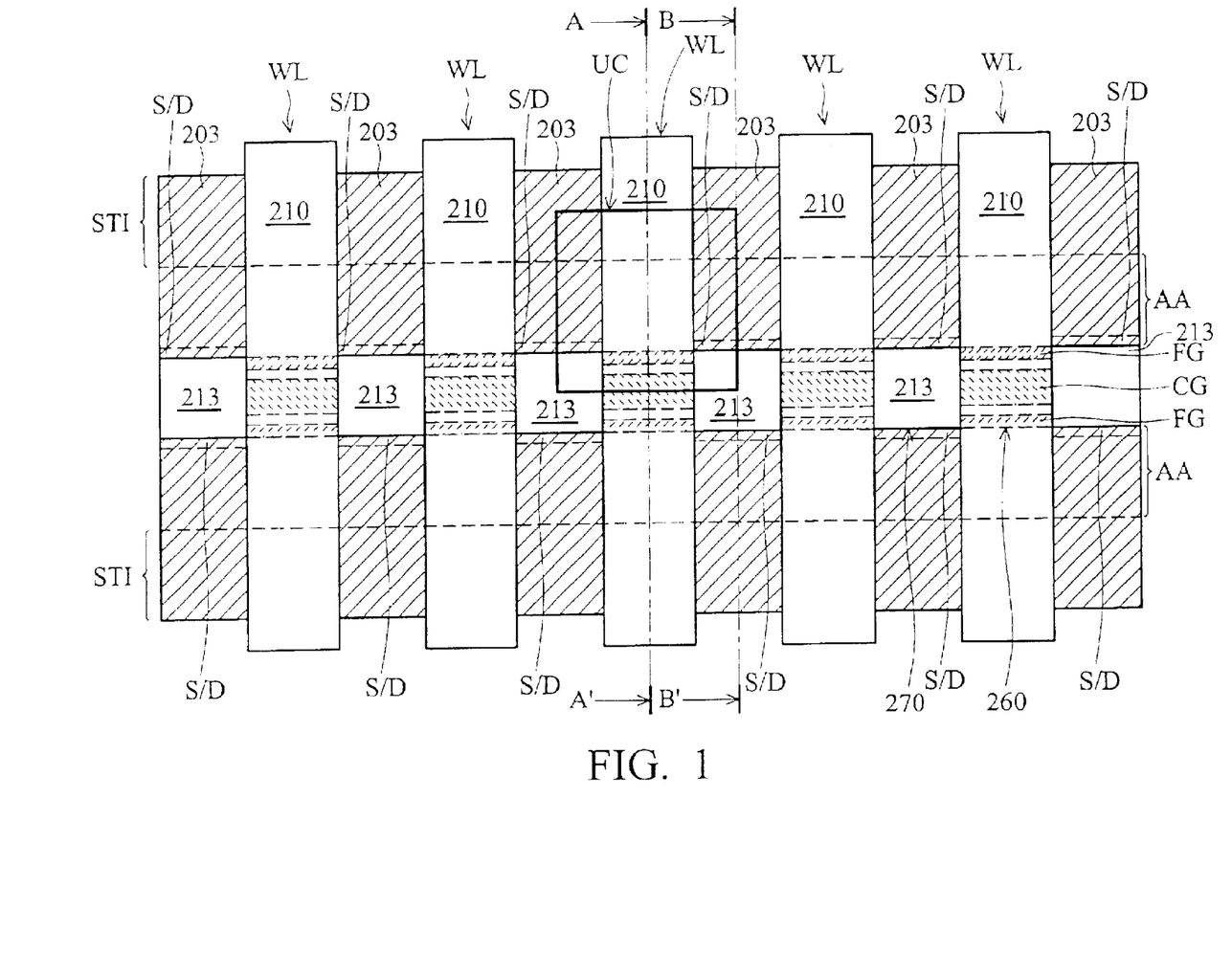
FIG. 1 is schematic top view of a stacked gate flash memory device of the invention.

The present invention provides a stacked gate flash memory device that can deal with a demand for increased capacity of memory cells. In FIG. 1, a top view of the stacked gate flash memory device in accordance with the present invention is shown. Structure of individual memory cells is disposed in the cell trenches 250' (not shown) under first area 260 along the A~A' phantom line, between two shallow isolation trench (STI) regions and two active areas AA. Adjacent isolation trenches 250" (not shown) of the memory cells are disposed under the second area 270 along the B~B' phantom line to insulate devices within cell trenches 250' (not shown), between two shallow isolation trench (STI) regions and two active areas AA.

Moreover, a unit cell UC as shown in FIG. 1 illustrates a cell trench 250' (not shown) under a first area 260 having a control gate CG and a floating gate FG therein. The unit cell can be connected with other unit cells by a wordline WL thereon. The cell unit UC further comprises two adjacent isolation trenches 250" formed by second insulation layer 213. In addition, a pair of source/drain regions S/D is respectively disposed on the same side of the substrate of each adjacent cell trench 250'. Functions of these two source/drain regions S/D can be decided and suitably modified according to the practical bitline design by those skilled in the art.

FIGS. 3a~3e and FIGS. 4a~4e respectively illustrate the cross-sections of a fabricating process along lines A~A' and B~B' according to an embodiment of the present invention. In addition, the corresponding top views of FIGS. 3a~3e and FIGS. 4a~4e are also illustrated through FIGS. 2a~2e.

Figure 3A:
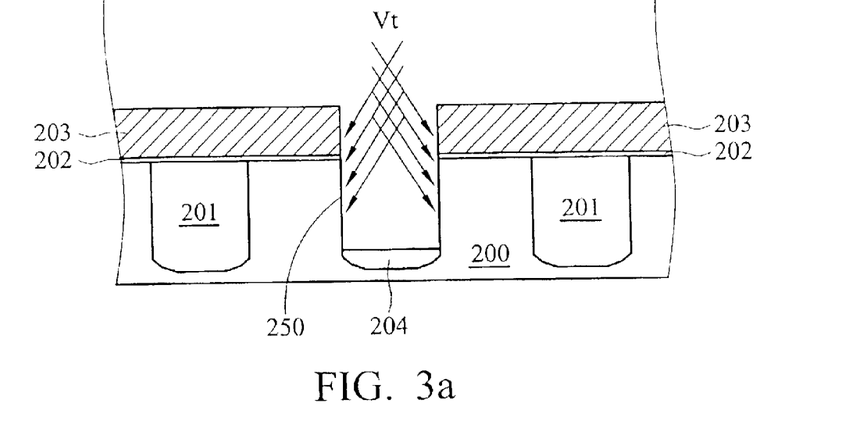
FIGS. 3a~3e are cross-sections of the fabricating process along the A—A' phantom line in FIG. 1.
Figure 4A:
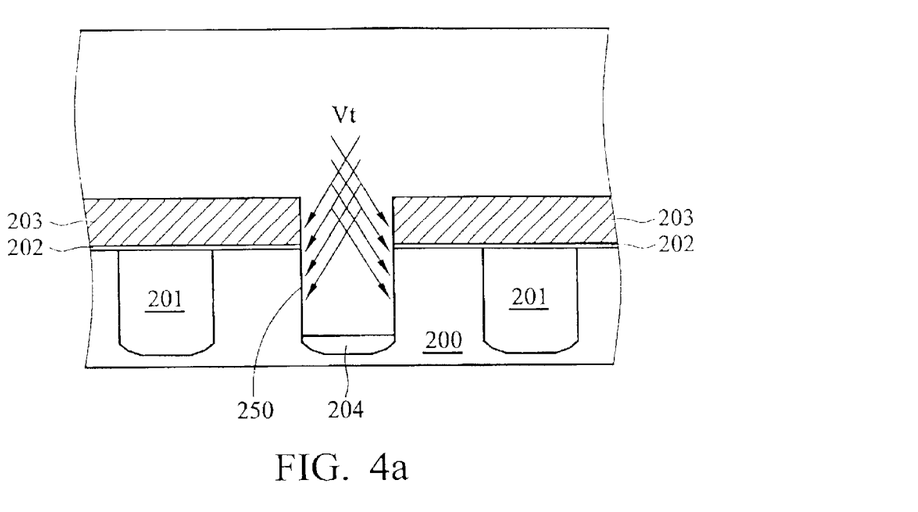
FIGS. 4a~4e are cross-sections of the fabricating process along the B—B' phantom line in FIG. 1.

In FIGS. 3a and 4a, a semiconductor substrate 200, for example a P-type silicon substrate, is provided. Using shallow trench isolation (STI) technology, two insulating layers 201 are formed in substrate 200 and filled with insulating material (for example silicon dioxide) to form shallow isolation trench (STI) regions. Insulating layer 201 is referred to as shallow isolation trench (STI) regions henceforth.

Next, a pad oxide layer 202 and a mask layer 203 are sequentially formed on the substrate 200 and then defined by lithography and etching to form a long trench 250 with a depth about 2500 Å to 3500 Å in substrate 200. The long trench 250 is parallel to and between the two adjacent STI regions (insulating layer 201). Substrate 200 between the long trench 250 and adjacent STI region (insulating layer 201) is active area AA in which the source/drain region is formed.

Figure 2A:
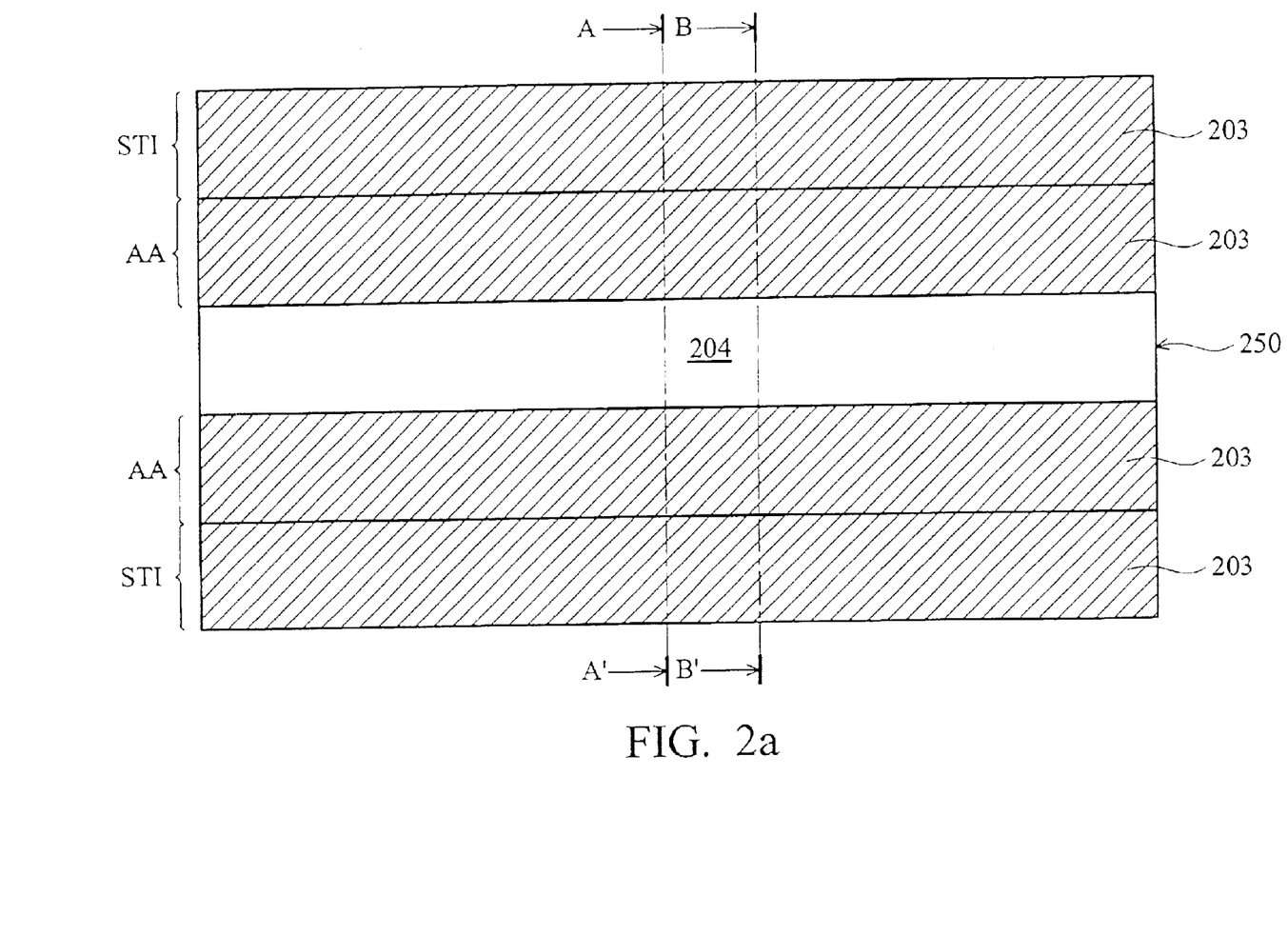
FIGS. 2a~2e are schematic top views of corresponding cross-sections in one embodiment of the invention.
Figure 2B:
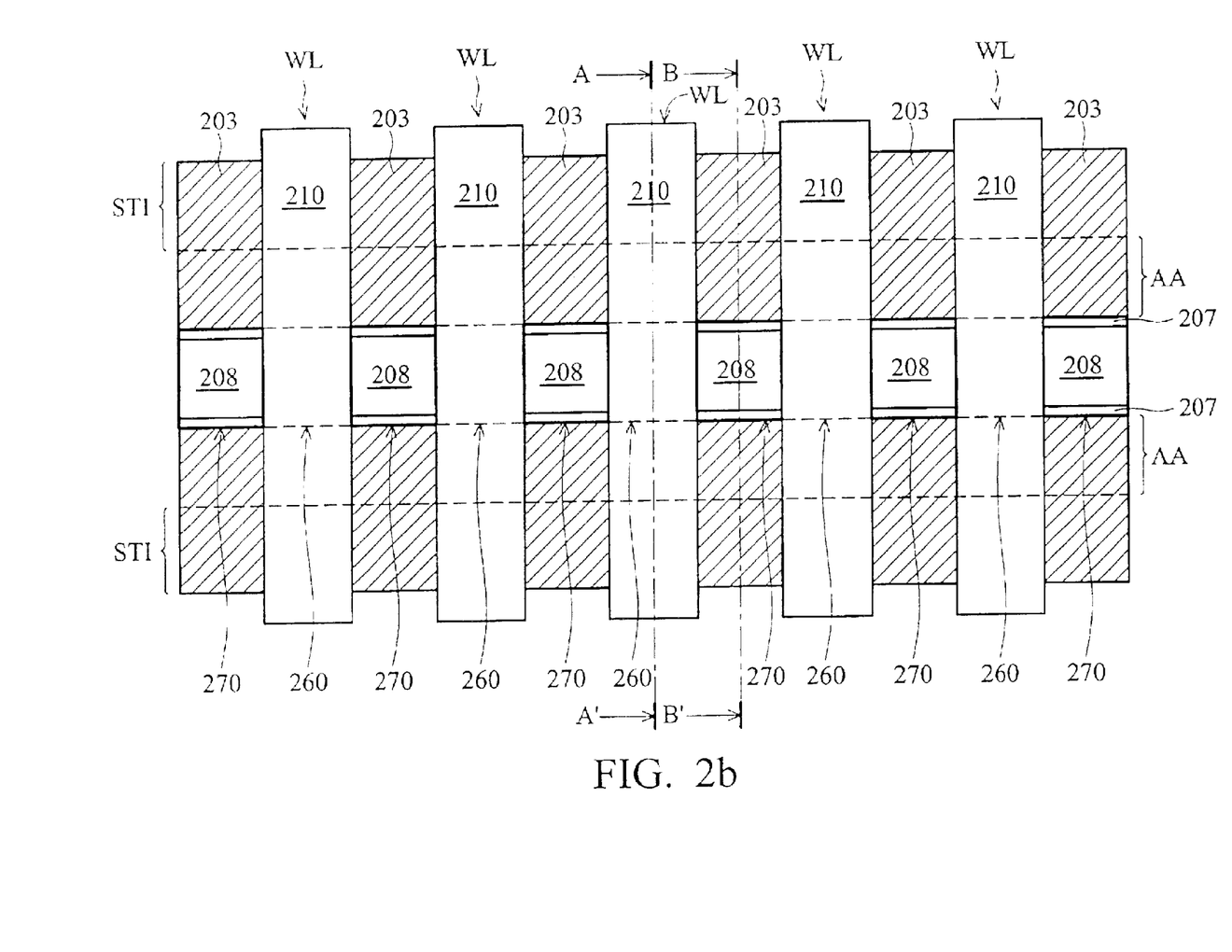
Figure 2C:
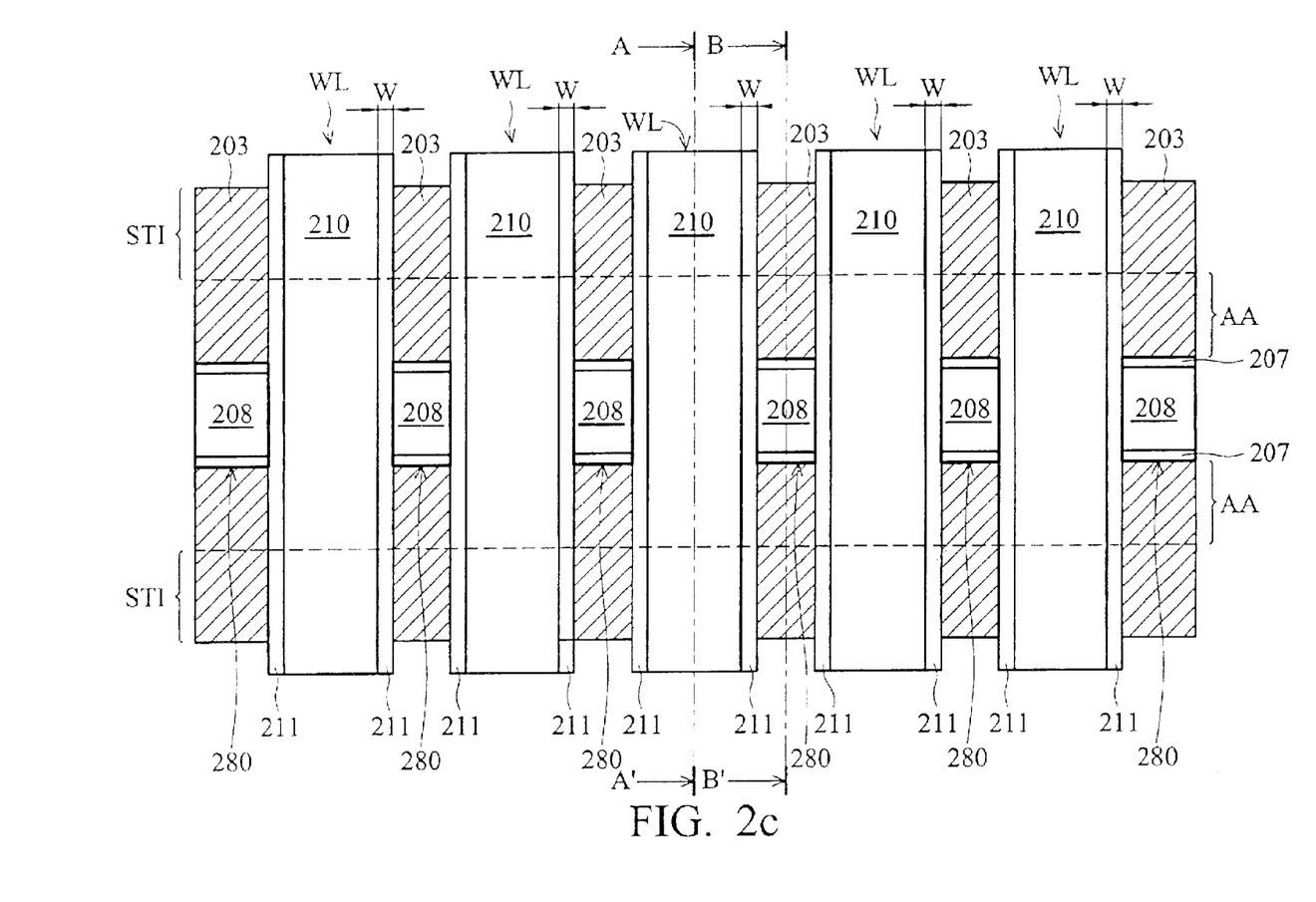

Next, an insulating material is deposited on mask layer 203 and fills the long trench 250. The insulating material is, for example, silicon dioxide. The insulating material above the mask layer 203 is removed through conventional etching. The insulating material within the long trench 250 is further recessed leaving a bottom insulating layer 204 of about 500 Å to 1000 Å in the long trench 250. Then a threshold voltage implant process Vt is performed on sidewalls of the long trench 250 to adjust the threshold voltage of the memory cell. The top view at this moment is illustrated in FIG. 2a. The bottom insulating layer 204 is disposed on the bottom of the long trench 250, adjacent active areas AA and adjacent shallow trench isolation (STI) regions are covered by the mask layer 203.

Figure 3B:
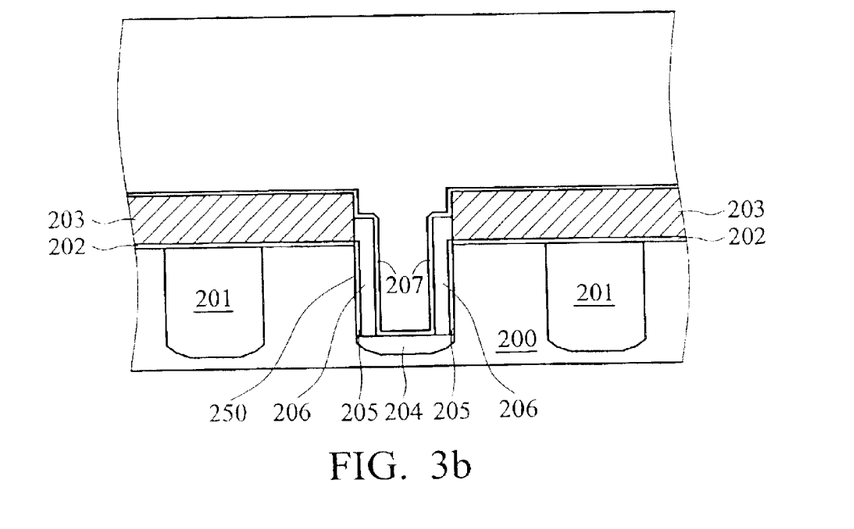
Figure 4B:
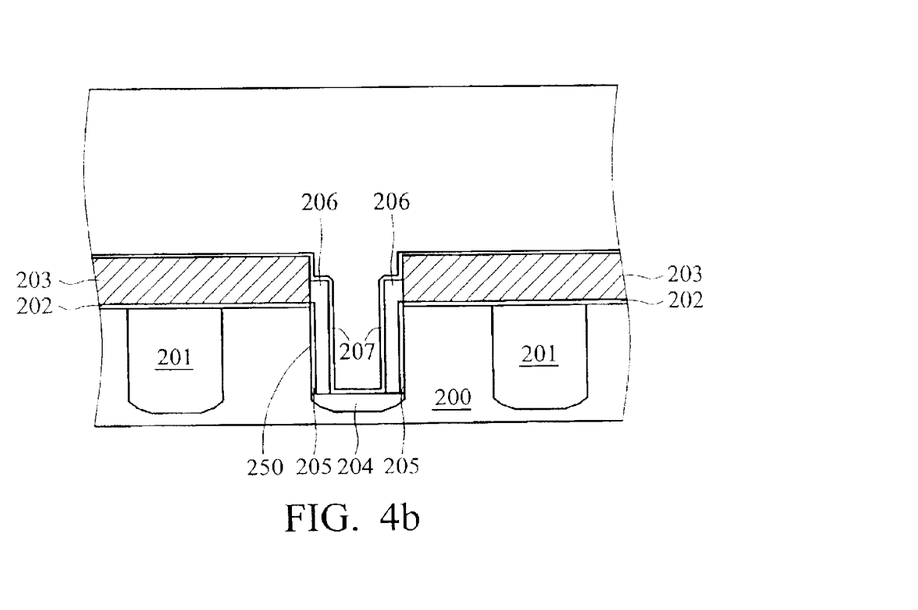

In FIGS. 3b and 4b, a tunneling oxide layer 205 is formed on each sidewall of the long trench 250. The tunneling oxide layer 205 is, for example, silicon dioxide formed by thermal oxidation. Next a layer of floating gate material is conformally deposited on mask layer 203 and in the long trench 250. The material is then etched back and a floating gate 206 covering the tunneling oxide layer 205 on each sidewall of the long trench 250 is thus formed. The floating gate 206, for example, is N-type dopant doped polysilicon formed by LPCVD.

Next, a conformal inter-gate dielectric layer 207 about 100 Å to 300 Å is deposited on the mask layer 203 and in the long trench 250, covering those floating gates 206 and the bottom insulating layer 204 therein. The inter-gate dielectric layer 207 is, for example, silicon dioxide formed by LPCVD.

Figure 3C:
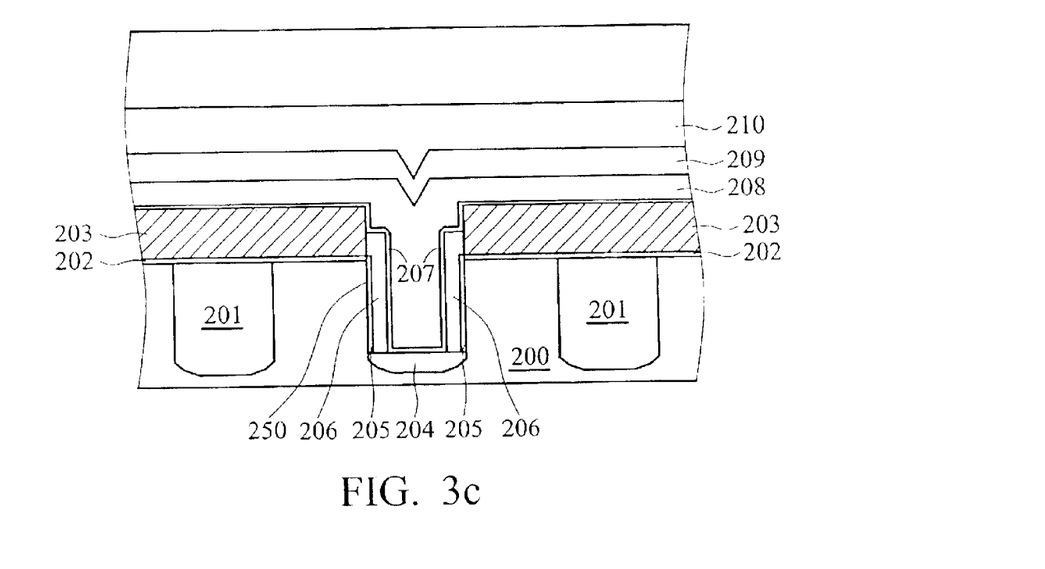
Figure 4C:
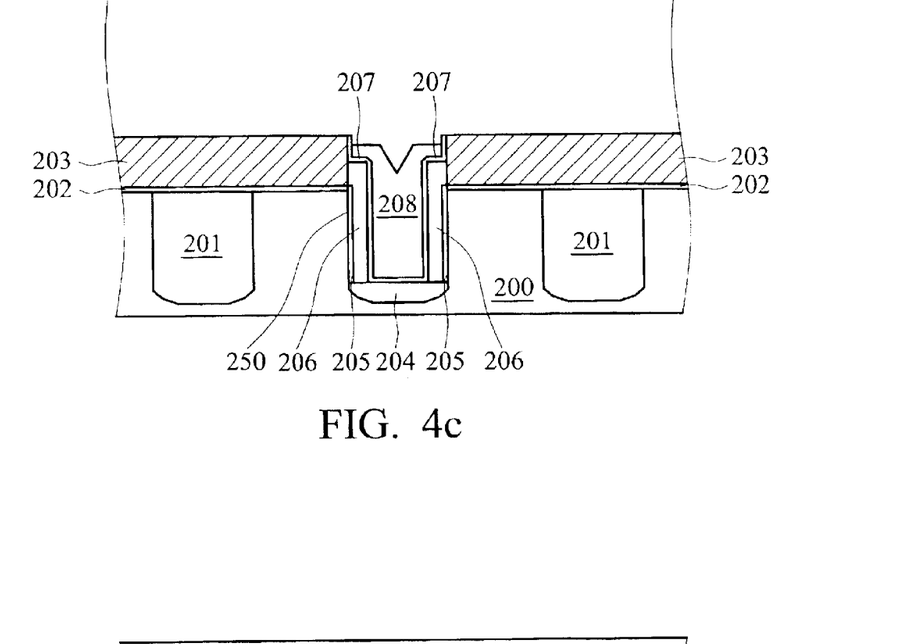

In FIGS. 3c and 4c, a polysilicon layer 208 is blanketly deposited on mask layer 203 filling the long trench 250. The polysilicon layer 208 is, for example, n-type dopant doped polysilicon formed by LPCVD. Next, a metal layer 209 and a protecting layer 210 are sequentially deposited on the polysilicon layer 208. The metal layer 209 can be tungsten silicide ($WSi_x$) and the protecting layer 210 can be silicon nitride. The mentioned layers are then defined by lithography and etching to form a plurality of parallel wordlines WL (not shown) in a second direction. The second direction of the wordline WL is perpendicular to the first direction of the long trench 250.

At this moment, the portion of polysilicon layer 208 below the mask layer 203 can be a control gate of a memory cell and the wordline WL (not shown) can comprise the patterned protecting layer 210, the metal layer 209 and the polysilicon layer 208 above mask layer 203. As seen in top view shown in FIG. 2b, the long trench 250 is divided into a plurality of first areas 260 covered by the wordlines WL and a plurality of second areas 270 not covered by the wordlines WL. The inter-gate dielectric layer 207 and the polysilicon layer 208 under the second area 270 are exposed.

Next, spacer 211 is formed on each sidewall of the wordlines, partially covering the second area by blanketly depositing a layer of insulating material, for example silicon dioxide, and etching back the insulating material. At this moment, as top view shown in FIG. 2c, a width W of the spacer 211 partially covering the second area 270 is about 100 Å to 200 Å and thus a plurality of third areas 280 not covered by the wordlines WL and spacers 211 are formed over the long trench 250.

Figure 3D:
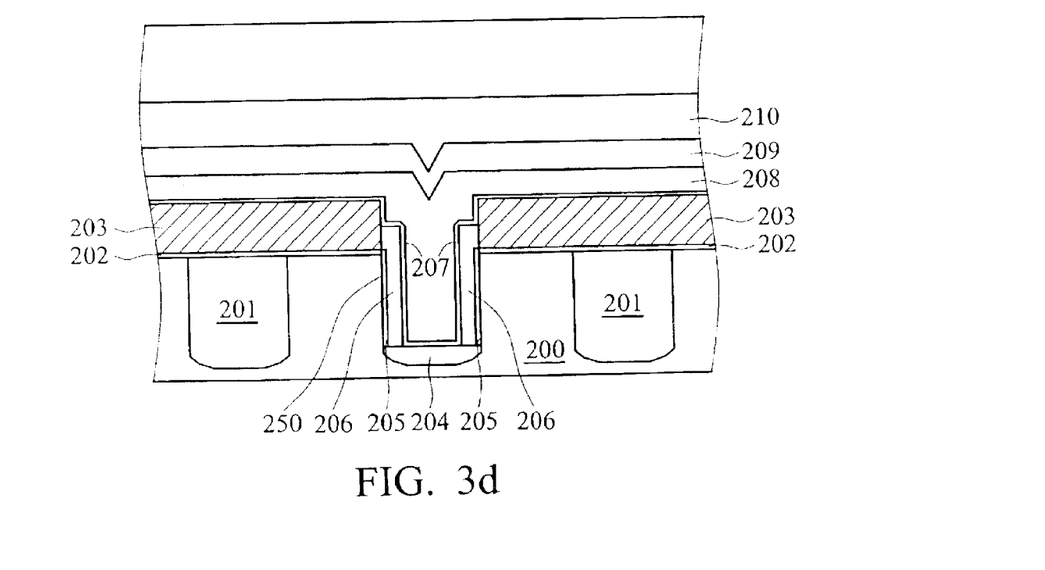
Figure 4D:
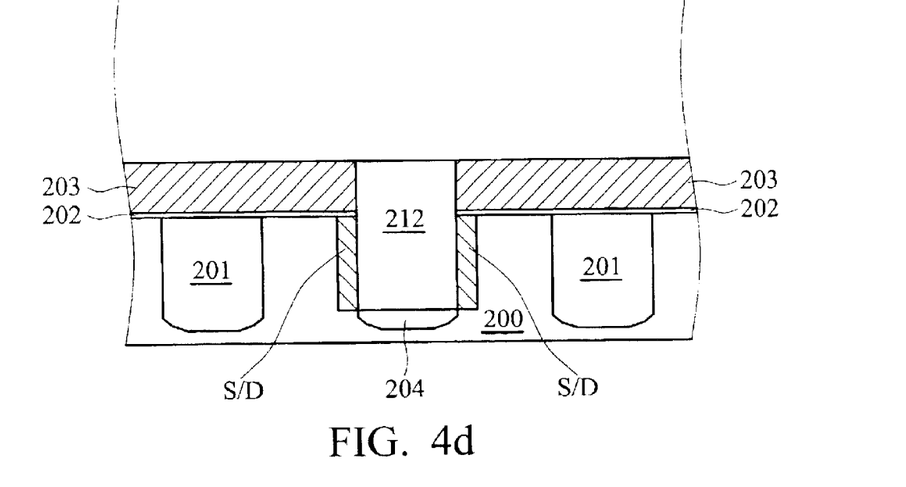

In FIGS. 3d and 4d, the material under the third area 280 is anisotropically removed by a proper etching process such as plasma etching, stopping on the bottom insulating layer 204 therein. The anisotropic etching process performed is a highly selective between the material of the mask layer 203 (for example silicon nitride) and the material under the third area 280 (for example silicon dioxide and polysilicon).

Next, a doped material is filled in the third area 280 and then etched, leaving a doped material layer 212 under the third area 280. The doped material layer 212 is, for example, n-type dopant polysilicon such as arsenic (As) doped polysilicon. Next, a high temperature annealing process (not shown) is performed to diffuse the dopant in the doped material layer 212 into the substrate 200 adjacent the third region 280 and finally diffused into the substrate 200 adjacent to the second region 270. Thus, source/drain regions S/D are respectively formed on the same side of the substrate 200 of two second areas 270 adjacent to the first area 260. It should be noticed that functions of individual source/drain regions S/D can be decided according to the practical bitline and relative contact via design. Thus, the practical function of source/drain region S/D can be suitably modified by those skilled in the art.

Figure 2D:
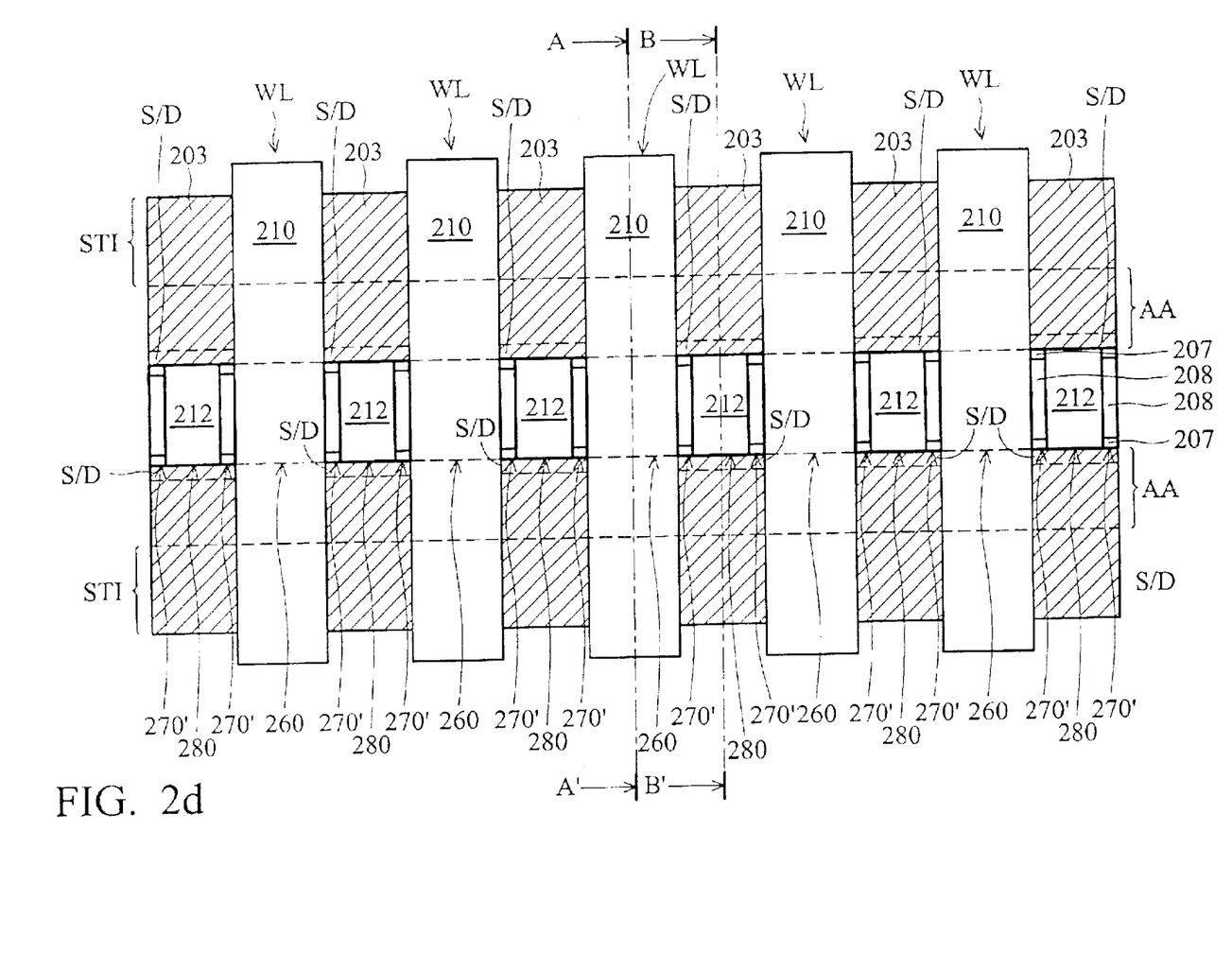

Next, spacers 211 are removed by etching and the second area 270 is then exposed. The etching method is, for example, wet etching. Thus, the second area 270 can be further divided into the third area 280 not covered by the wordline WL and spacers 211 and two adjacent fourth areas 270' previously covered by the spacers 211. At this time, as shown in FIG. 2d, doped material layer 212 is formed under the third area 280. The material under the fourth area 270' is the same as under the first area 260. The material under the fourth area 270' can be a buffer layer to prevent dopants in the doped material layer 212 from diffusing into the material under the first area 260 during the mentioned high temperature annealing. Thus, performance of the device formed under the first area 260 is not affected.

Figure 3E:
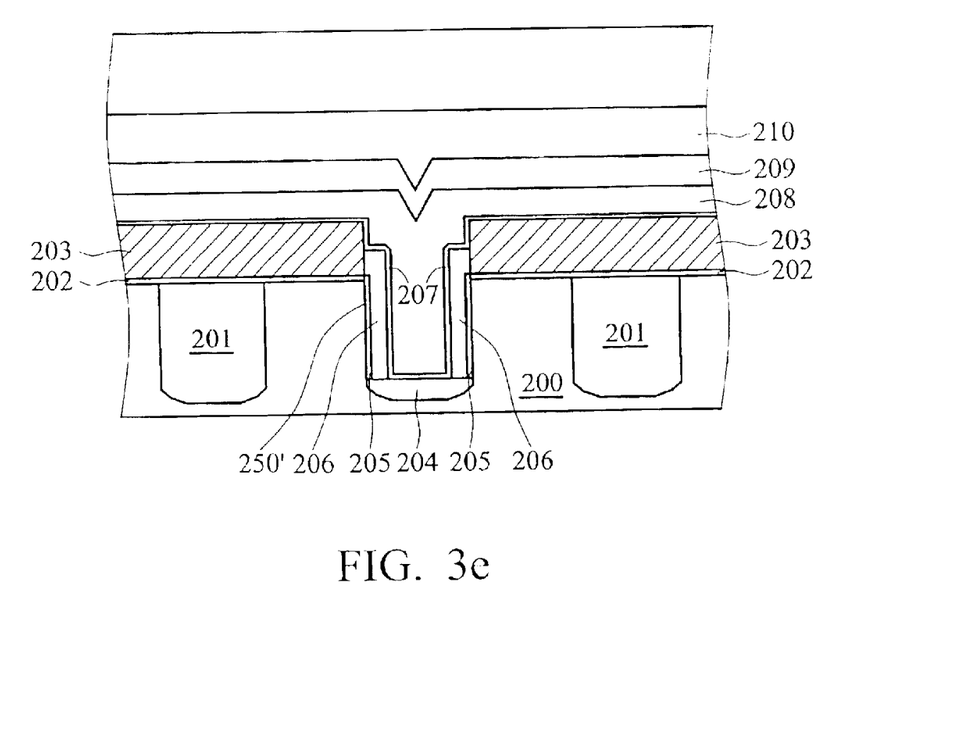
Figure 4E:
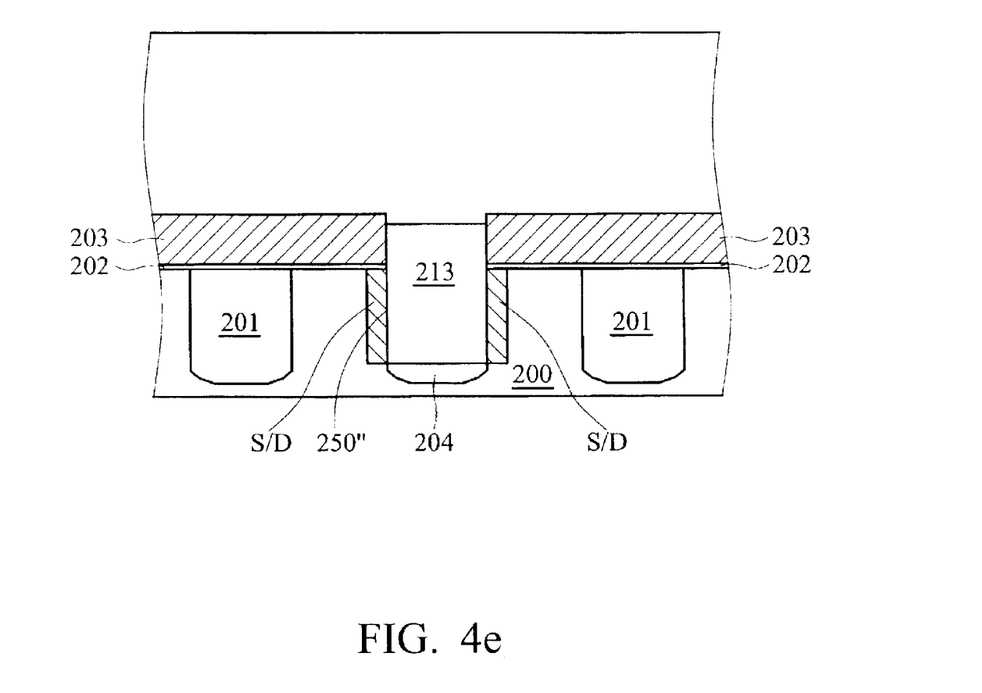

In FIGS. 3e and 4e, the material under the second area 270 is removed by a proper etching method and stops on the bottom insulating layer 204. The etching method is, for example, plasma etching. An insulating material is then deposited in the second area 270 and etched back, forming a second insulating layer 213 under the second area 270. An isolation trench 250" is then formed under the second area 270 and a cell trench 250' is then formed under the first area 260. The material of the second insulating layer 213 is, for example, silicon dioxide formed by LPCVD.

Figure 2E:
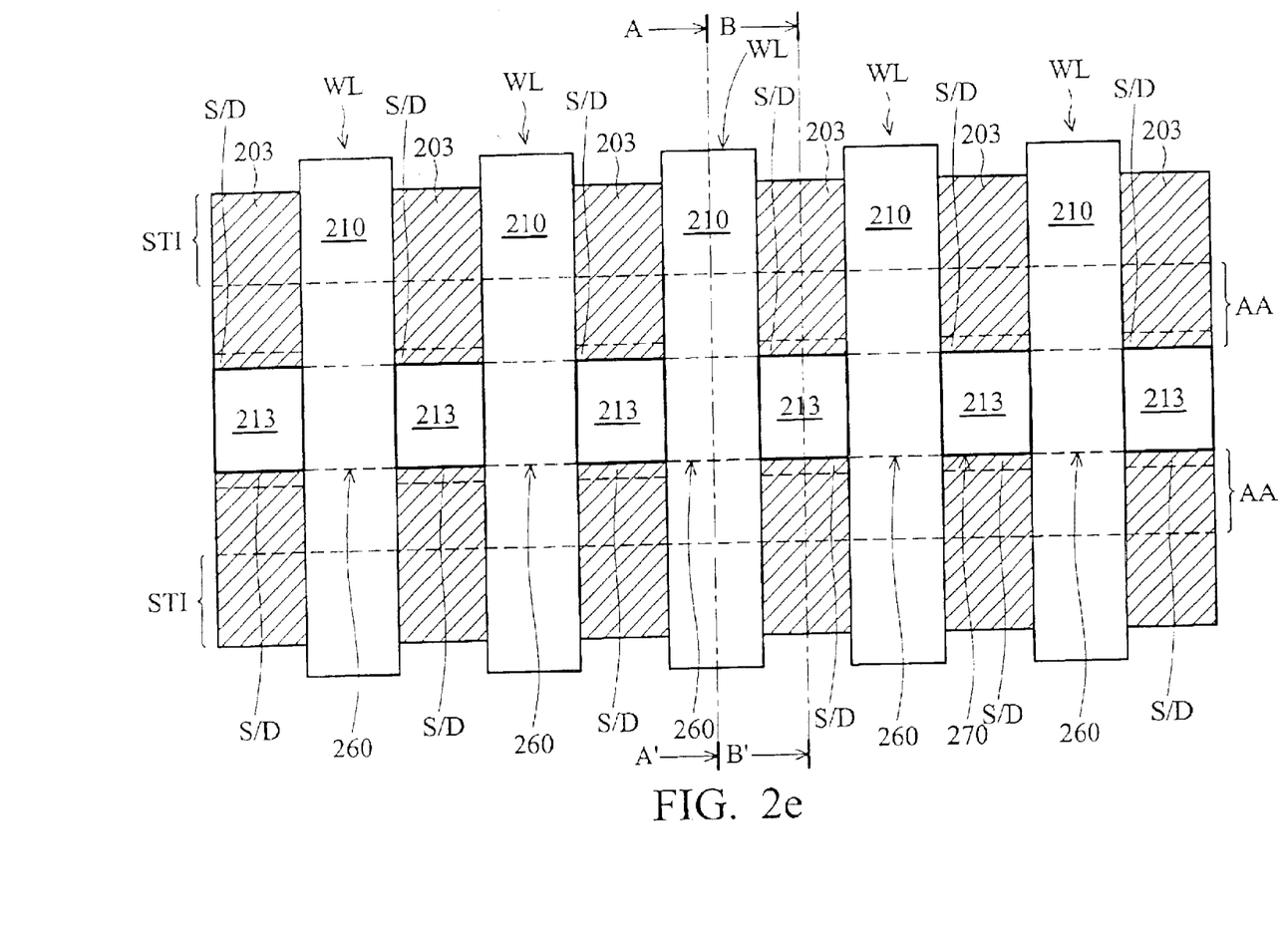

At this moment, as shown in FIG. 2e, cell trench 250' (shown in FIG. 3e) is disposed under the first area 260 and isolation trench 250" (shown in FIG. 4e) is disposed in the second area 270 adjacent to the first area 260. The cell trench 250' has two substrate sides contacting the adjacent substrate 200 and two isolation sides respectively contacting adjacent isolation trenches 250". The isolation trench 250" has two substrate sides contacting the substrate 200 where source/drain regions S/D therein and two cell sides respectively contact the cell trench 250'.

The stacked gate flash memory cell in accordance with the present invention illustrated in FIGS. 3e and 4e comprises a bottom insulating layer 204 disposed on the bottom of the cell trench 250' under the first area 260 and the bottom of the isolation trench 250" under the second area 270. A pair of tunnel oxide layers 205 formed in the cell trench 250', each is disposed on the substrate side of the cell trench 250' and the bottom insulating layer 204. A pair of floating gates 206 formed in cell trench 250', each is disposed on the tunnel oxide layer 205. A conformal inter-gate dielectric layer 207 is formed in cell trench 250', overlying the bottom insulating layer 204 and the floating gate layers 206 therein. A control gate (part of the polysilicon layer 208 within the cell trench 250') formed in the cell trench 250', overlies the inter-gate dielectric layer 207. Two pairs of source/drain regions, each is respectively disposed on the same substrate side of each isolation trenches 250" adjacent to the cell trench 250'.

Compared with flash memory cell of the Prior Art, the present invention has the following advantages.

First, cells of the flash memory device in accordance with the invention are trench-type stacked gate flash memory cells disposed in trenches within a substrate rather than on the surface of a substrate, as in the Prior Art. Cells of the invention can achieve higher integration of memory cells.

In addition, cell structure of the invention is symmetrical with the control gate (shown as part of the polysilicon layer 208) therein. A cell trench 250' and two adjacent isolation trenches 250' are formed in substrate. In a cell trench 250', tunnel oxide layers 205, floating gates 206 and inter-gate dielectric layer 207 formed therein are symmetrical with the control gate overlying the inter-gate dielectric layer 207.

Second, the channel between the source region and the drain region is horizontal. Source and drain regions (as shown source/drain regions S/D in FIG. 4e) can be formed in the same substrate side of the adjacent isolation trenches 250". Functions of source and drain regions can be decided according to the practical bitline design and the channel current flowing horizontally therein rather than the vertical direction of the Prior Art. In addition, the source and drain regions in the present invention are formed by thermal diffusion rather than impurity implantation in the Prior Art.

Third, cells of the stacked gate flash memory device of the present invention are formed into the substrate. Thus, the size of each flash memory cell can be minimized and the integration of the memory cell can be increased, also increasing capacity of a flash memory device and the current within a cell, by enlarging the depth of the cell trench. In addition, most of the fabricating processes in the invention are self-aligned, such that additional lithography processes required and number of masks for the whole fabricating process can be reduced. The complexity of fabricating the staked gate flash memory device of the present invention is thereby reduced.

Furthermore, most patterns of the masks for fabricating the stacked gate flash memory device are rectangular and easily fabricated, and costs of mask fabrication are reduced.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method of fabricating a stacked gate flash memory cell, comprising:

providing a substrate;

forming two parallel shallow trench isolation (STI) regions along a first direction in the substrate;

forming a long trench in the substrate between the STI regions, wherein the long trench is parallel to the STI regions;

forming a bottom insulating layer in the long trench;

performing a threshold voltage (Vt) implant process on the sidewalls of the long trench;

forming a tunnel oxide layer on each sidewall of the long trench;

forming a floating gate on each sidewall of the long trench, covering the tunnel oxide layer thereon;

forming a conformal inter-gate dielectric layer overlying the floating gates and the bottom insulating layer within the long trench;

blanketly depositing a polysilicon layer covering the substrate and the inter-gate dielectric layer within the long trench;

blanketly depositing a metal layer on the polysilicon layer;

blanketly depositing a protecting layer on the metal layer;

forming a plurality of parallel wordlines along a second direction, dividing the long trench into a plurality of first areas covered by the wordlines and a plurality of second areas not covered by the wordlines over the long trench;

forming a plurality of source/drain regions in the sidewalls of the long trench oppositely adjacent to the second areas; and forming a second insulating layer within the second areas, wherein a plurality of cell trenches are formed under the first areas and a plurality of isolation trenches are formed under the second areas.

2. The method as claimed in claim 1, wherein the first direction is perpendicular to the second direction.

3. The method as claimed in claim 1, wherein the substrate is a P-type silicon substrate.

4. The method as claimed in claim 1, wherein, prior to formation of a long trench in the substrate, a pad oxide layer and a mask layer are formed on the substrate.

5. The method as claimed in claim 1, wherein the tunnel oxide layer is formed by thermal oxidation.

6. The method as claimed in claim 1, wherein the floating gate and the polysilicon layer are N-type dopant doped polysilicon.

7. The method as claimed in claim 1, wherein the inter-gate dielectric layer is silicon dioxide.

8. The method as claimed in claim 1, wherein forming a plurality of source/drain regions in the sidewalls of the substrate oppositely adjacent to the second areas further comprises:

forming a spacer on each sidewall of the word lines, partially covering the second area, forming a plurality of third areas not covered by the wordlines and the spacers;

anisotropically etching the polysilicon layer, the inter-gate dielectric layer, the floating gate and the tunnel oxide layer under the third area, stopping on the bottom insulating layer thereof;

forming a doped material layer under the third area; and performing a high temperature annealing process to diffuse the dopant in the doped material layer into the sidewalls of the long trench oppositely adjacent to the second areas.

9. The method as claimed in claim 8, wherein forming a second insulating layer within the second areas further comprises:

etching the spacer by wet etching until the second areas are exposed;

etching layer, the doped material layer, the remaining polysilicon layer, the remaining floating gate and the remaining tunnel oxide layer in the second areas, stopping on the bottom insulating layer therein; and forming a second insulating layer in the second areas.

10. The method as claimed in claim 1, wherein the method for forming the floating gate and the polysilicon layer is LPCVD.

11. The method as claimed in claim 1, wherein the method for forming the inter-gate dielectric layer is LPCVD.

12. The method as claimed in claim 1, wherein the metal layer is tungsten silicide ($WSi_x$).

13. The method as claimed in claim 1, wherein the protecting layer is silicon nitride.

14. The method as claimed in claim 8, wherein the doped material layer is N-type dopant doped polysilicon.

15. The method as claimed in claim 14, wherein N-type dopant doped polysilicon is arsenic (As) doped polysilicon.

16. The method as claimed in claim 9, wherein the method for forming the second insulating layer is LPCVD.

17. The method as claimed in claim 9, wherein the second insulating layer is silicon dioxide.

18. The method as claimed in claim 9, wherein the method for etching the doped material layer in the second areas is plasma etching.

* * * * *